United States Patent
Lin et al.

(10) Patent No.: US 7,225,387 B2
(45) Date of Patent: May 29, 2007

(54) MULTILEVEL PARALLEL CRC GENERATION AND CHECKING CIRCUIT

(75) Inventors: Ming-i M. Lin, South Burlington, VT (US); Brian J. Connolly, Williston, VT (US); Todd E. Leonard, Williston, VT (US); Gregory J. Mann, Wheaton, IL (US); Jonathan H. Raymond, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 576 days.

(21) Appl. No.: 10/771,823

(22) Filed: Feb. 3, 2004

(65) Prior Publication Data

US 2005/0172205 A1   Aug. 4, 2005

(51) Int. Cl.
H03M 13/00 (2006.01)
(52) U.S. Cl. .................................. 714/758; 714/757
(58) Field of Classification Search ................ 714/758, 714/757
See application file for complete search history.

(56) References Cited

U.S. PATENT DOCUMENTS

| | | | | |
|---|---|---|---|---|
| 4,454,600 A | | 6/1984 | LeGresley | 371/25 |
| 4,937,828 A | | 6/1990 | Shih et al. | 371/37.1 |
| 5,132,975 A | | 7/1992 | Avaneas | 371/37.6 |
| 5,282,214 A | | 1/1994 | Dravida | 371/37.6 |
| 5,375,127 A | * | 12/1994 | Leak et al. | 714/772 |
| 5,383,204 A | | 1/1995 | Gibbs et al. | 371/37.7 |
| 5,537,403 A | * | 7/1996 | Cloonan et al. | 370/352 |
| 5,568,477 A | * | 10/1996 | Galand et al. | 370/229 |
| 5,671,238 A | | 9/1997 | Chen et al. | 371/37.6 |
| 5,740,075 A | * | 4/1998 | Bigham et al. | 709/229 |
| 5,748,652 A | | 5/1998 | Kim | 371/53 |
| 5,787,094 A | | 7/1998 | Cecchi et al. | 371/53 |
| 5,878,057 A | * | 3/1999 | Maa | 714/757 |
| 5,953,344 A | * | 9/1999 | Dail et al. | 370/443 |
| 6,052,815 A | * | 4/2000 | Zook | 714/758 |

(Continued)

OTHER PUBLICATIONS

Albertengo et al., Parallel CRC Generation, Oct. 1990 IEEE, pp. 63-71.

(Continued)

*Primary Examiner*—Albert Decady
*Assistant Examiner*—Mujtaba K. Chaudry
(74) *Attorney, Agent, or Firm*—Schmeiser, Olsen & Watts; William H. Steinberg (57) ABSTRACT

A CRC generator/checker for generating CRC results, comprising: a set of CRC circuits connected in series, each CRC circuit responsive to a different control signal generated by a control logic, each CRC circuit having a seed input adapted to receive a seed, a data input adapted to receive and process a different set of M-bits of a data unit and a result output adapted to generate a result, the result output of a previous CRC circuit connected to the seed input of an immediately subsequent CRC circuit, the seed input of a first CRC circuit connected to an output of a remainder register, an input of the remainder register connected to an output of a multiplexer, the result outputs of the multiplicity of CRC circuits connected to different inputs of the multiplexer, the multiplexer responsive to a select signal generated by the control logic.

30 Claims, 5 Drawing Sheets

U.S. PATENT DOCUMENTS

| | | | |
|---|---|---|---|
| 6,122,759 A * | 9/2000 | Ayanoglu et al. | 714/57 |
| 6,134,597 A * | 10/2000 | Rieth et al. | 709/237 |
| 6,167,389 A * | 12/2000 | Davis et al. | 705/412 |
| 6,188,699 B1 * | 2/2001 | Lang et al. | 370/463 |
| 6,223,320 B1 | 4/2001 | Dubey et al. | 714/757 |
| 6,357,032 B1 * | 3/2002 | Plotz et al. | 714/758 |
| 6,560,746 B1 | 5/2003 | Morsberger | 714/781 |

OTHER PUBLICATIONS

Pei et al., High-Speed Parallel CRC Circuits in VLSI, vol. 40, No. 4, Apr. 1992 IEEE, pp. 653-656.

McClannahan et al., High-Speed Parallel Cyclic Redundancy Check Generator, vol. 33, No. 5, Oct. 1990 IBM Technical Disclosure Bulletin.

* cited by examiner

MULTILEVEL PARALLEL CRC GENERATION AND CHECKING CIRCUIT

FIELD OF THE INVENTION

The present invention relates to the field of error detection in digital communications; more specifically, it relates to method and circuit for generating and checking a cyclic redundancy check (CRC) for a digital data unit.

BACKGROUND OF THE INVENTION

As the speed of digital communication networks increases and data bandwidths become wider current serial CRC calculation methods and circuits are increasing gating transmission speed because of the time required to generate the CRC or are consuming ever increasing amounts of silicon real estate and power as gate counts increase. Even increasing gate counts not only impacts the physical layout in terms of wireability, but also increases the power consumption of the CRC circuit. Additionally, as data size decreases, the resultant large increase in the size of the CRC increases because of the poor resolution of parallel CRC circuits. Therefore, an improved CRC generation/checking methodology and circuit design is required for high speed, high resolution, and high bandwidth digital communication applications.

SUMMARY OF THE INVENTION

A first aspect of the present invention is a CRC generator/checker for generating CRC results, comprising: a set of CRC circuits connected in series, each CRC circuit responsive to a different control signal generated by a control logic, each CRC circuit having a seed input adapted to receive a seed, a data input adapted to receive and process a different set of M-bits of a data unit and a result output adapted to generate a result, the result output of a previous CRC circuit connected to the seed input of an immediately subsequent CRC circuit, the seed input of a first CRC circuit connected to an output of a remainder register, an input of the remainder register connected to an output of a multiplexer, the result outputs of the multiplicity of CRC circuits connected to different inputs of the multiplexer, the multiplexer responsive to a select signal generated by the control logic.

A second aspect of the present invention is a CRC generator/checker, comprising: a multiplicity of CRC circuits adapted to process a single-byte of data from a data bus, each CRC circuit having a seed input, a data input adapted to receive a different byte of data from the bus, a control input and a result output; an multiplexer having an output connected to an input of a remainder register, a select input and a multiplicity of inputs, each result output of each the CRC circuit connected to a different input of the multiplexer; each CRC circuit connected in series, the result output of a previous CRC circuit connected to the seed input of an immediately subsequent CRC circuit, the seed input of a first CRC circuit connected to an output of the remainder register; and a control logic having a select output and a multiplicity of control outputs, the select output connected to the select input of the multiplexer and the control outputs connected to corresponding control inputs of the CRC circuits.

A third aspect of the present invention is a method of generating and checking a CRC result, comprising: providing a control circuit for generating control signals and a select signal; providing a multiplexer; and providing a set of CRC circuits connected in series, each CRC circuit responsive to a different control signal generated by a control logic, each CRC circuit having a seed input adapted to receive a seed, a data input adapted to receive and process a different set of M-bits of a data unit and a result output adapted to generate a result, the result output of a previous CRC circuit connected to the seed input of an immediately subsequent CRC circuit, the seed input of a first CRC circuit connected to an output of a remainder register, an input of the remainder register connected to an output of the multiplexer, the result outputs of the multiplicity of CRC circuits connected to different inputs of the multiplexer, the multiplexer responsive to a select signal generated by the control logic.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present invention, the term data unit is defined as a set of related data bits or data bytes. The size of a data unit can be variable and the number of bits or bytes in a data unit does not matter. Examples of data units include but are not limited to data packets, asynchronous transfer mode (ATM) cells and frames. The notation [|FUNC|] is read as the largest integer not exceeding the absolute value of FUNC. The notation 2^X should be read as $2^X$ and the notation 2^(X–Y) should be read as $2^{X-Y}$. Since one byte is equal to 8-bits, a circuit processing M-bits of data at one time is a 1-byte circuit when M is equal to eight.

Figure 1:
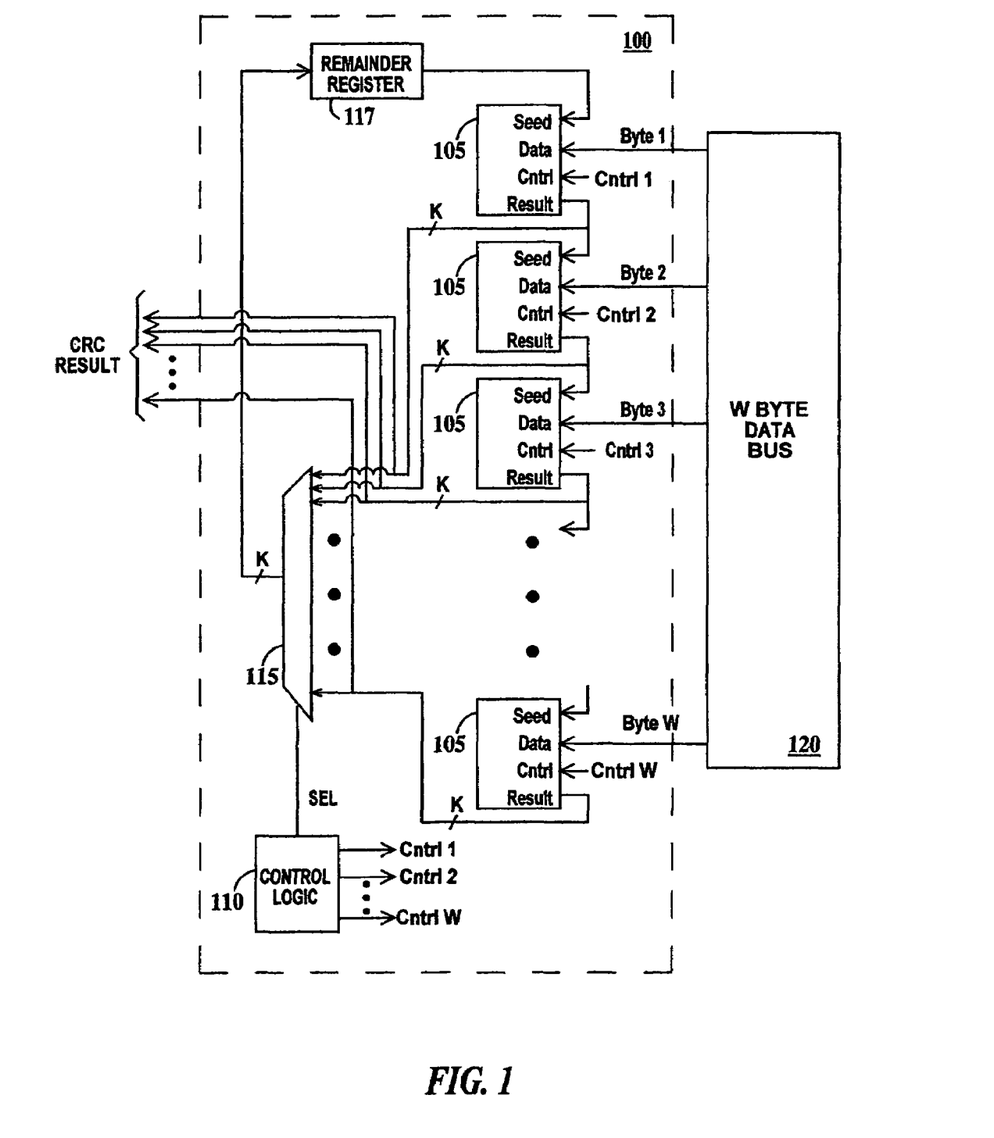
FIG. 1 is a schematic diagram of a CRC generator/checker circuit according to a first embodiment of the present invention.

FIG. 1 is a schematic diagram of a CRC generator/checker circuit 100 according to a first embodiment of the present invention. In FIG. 1, CRC generator/checker circuit 100 includes a multiplicity of one-byte (8-bit) CRC circuits 105, a control logic 110, a result multiplexer 115 and a K-bit CRC remainder registers 117. Each CRC circuit 105 has a seed input, a data input, a control input and a K-bit result output. K is dependent on the particular CRC parameter used to generate the CRC check bits that are appended to the data unit before transmission. Each data input of each CRC circuit 105 is adapted to receive a different byte of data from a W-byte wide data bus 120. (CRC circuits 105 may be considered 1-byte CRC circuits) Therefore, there are W CRC circuits 105 in CRC generator/checker circuit 100. CRC circuits 105 can be custom designed based on application and technology and CRC being implemented. While the internal structure of CRC circuits 105 can vary, the inputs, output and function of CRC circuits is well known and many examples exist.

CRC circuits 105 are connected in series, the result output of a previous CRC circuit connected to the seed input of an immediately subsequent CRC circuit. Each result output of each CRC circuit 105 is also connected to a different input of result multiplexer 115. The output of result multiplexer 115 is connected to the input of remainder register 117. The result outputs of each CRC circuit 105 form the CRC RESULT of CRC generator/checker 100. Multiplexer 115 is responsive to a SEL signal generated by control logic 110. The SEL signal chooses the result of the CRC circuit processing the last byte of the current data. The output of remainder register 117 is connected to the seed input of the first CRC circuit 105 (the one receiving byte 1). Control logic 110 generates one bit control signals CNTRL1 through CNTRLW based on delimiters in the data stream on data bus 120. Each control signal CNTRL1 through CNTRLW is connected to a corresponding control input of CRC circuits 105. Control signals determine if the incoming seed is to be used by a particular CRC circuit 105 of if the seed is to be reset internally by the CRC circuit itself. Thus, circuit 100 can handle a data unit of any number of bytes.

In one example, a logical 1 control signal on a particular CRC circuit 105 will disconnect the seed input from of the particular CRC circuit from the result output of a previous CRC circuit 105 and cause the particular CRC to generate a reset K-bit seed internally, where K is dependent on the CRC parameter by CRC generator/checker 100. In one example, the internally generated seed is all logical 0s. In one example W is 32. The operation of CRC generator/checker 100 is illustrated in FIGS. 2A through 2C and described infra.

CRC generator/checker circuit 100 processes a data unit as received via data bus 120. When used as a CRC generator, CRC RESULT of CRC generator/checker circuit 100 is concatenated to the end of the data unit and the thus modified data unit transmitted. When used as a CRC checker, the received data unit is run through CRC generator/checker circuit 100 and if CRC RESULT is all zeros or a fixed pattern of ones and zeros, then the data unit is considered to have been received free of transmission induced errors.

Figure 2A:
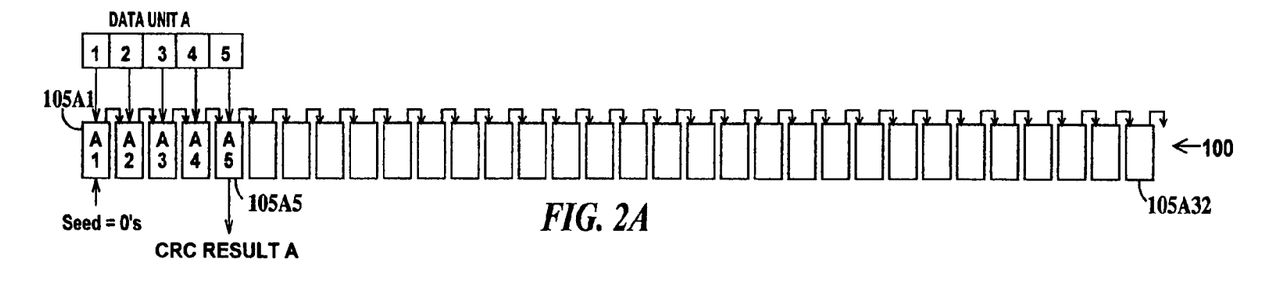
FIGS. 2A through 2C are diagrams illustrating the operation of the CRC generator/checker circuit of FIG. 1.
Figure 2B:
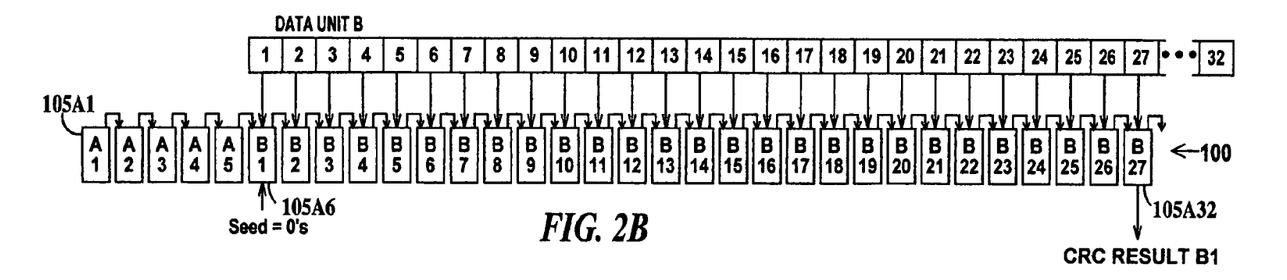
Figure 2C:
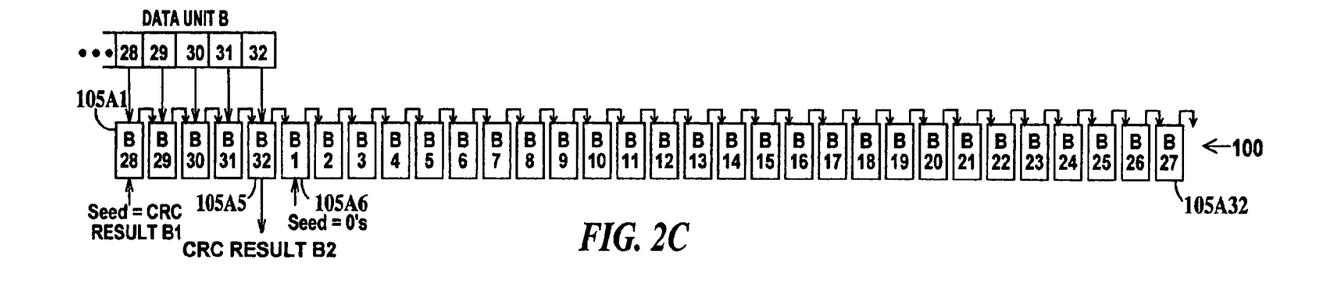

FIGS. 2A through 2C are diagrams illustrating the operation of CRC generator/checker circuit 100 of FIG. 1. Note that the data transfer to the CRC circuits illustrated in FIGS. 2A and 2B occur at the same clock cycle and the data transfer to the CRC circuits illustrated in FIG. 2C occur during the next clock cycle. In FIGS. 2A through 2C, CRC generator/checker circuit 100 is illustrated symbolically as a chain of 32 CRC circuits 105A1 through 105A32. In FIG. 2A, CRC generator 100 is initialized, CRC circuit 105A1 is seeded with all zeros or a fixed pattern of ones and zeros, a 5-byte data unit A is loaded into CRC 105 circuits 105A1 through 105A5, and the output result of CRC circuit 105A5 is CRC RESULT A. Data unit A with CRC RESULT A concatenated may then be transmitted or checked.

In FIG. 2B, CRC circuit 105A6 is seeded with all zeros or a fixed pattern of ones and zeros, the first 27 bytes of a 32-byte data unit B are loaded into CRC circuits 105A6 through 105A32, and the output result of CRC circuit 105A32 is CRC RESULT B1.

In FIG. 2C, the last 32 bytes of 32-byte data unit B are loaded into CRC circuits 105A1 through 105A5, the seed of 105A1 is the output result of CRC 105A32 and the output result of CRC circuit 105A5 is CRC RESULT B2 and CRC circuit 105A6 is seeded with all zeros or fixed pattern of ones and zeros in anticipation of the next data unit. Data unit B with CRC RESULT B2 concatenated may then be transmitted or checked.

Figure 3:
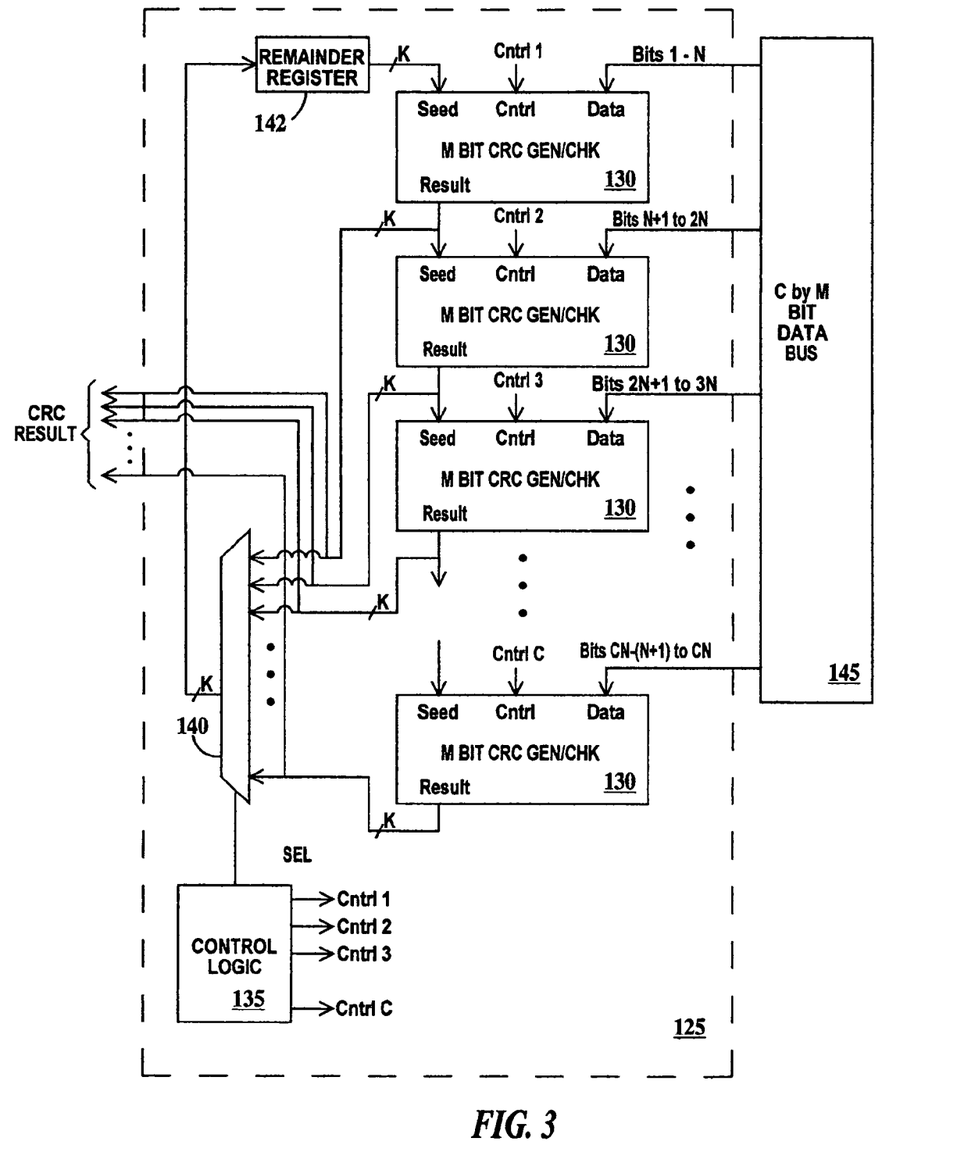
FIG. 3 is a schematic diagram of a CRC generator/checker circuit according to a second embodiment of the present invention.

FIG. 3 is a schematic diagram of a CRC generator/checker circuit 125 according to a second embodiment of the present invention. In FIG. 1, CRC generator/checker circuit 125 includes a multiplicity of M-bit CRC circuits 130, a control logic 135, a result multiplexer 140 and a remainder register 142. Each CRC circuit 130 has a seed input, a data input, a control input and a K-bit result output. K is CRC parameter dependent. Each data input of each CRC circuit 130 is adapted to receive a different set of M-bits of data from a C by N bit wide data bus 145. Therefore, there are C CRC circuits in CRC generator/checker circuit 125. CRC circuits 130 can be custom designed based on application and technology. While the internal structure of CRC circuits 1310 can vary, the inputs, output and function of CRC circuits is well known and many examples exist.

CRC circuits 130 are connected in series, the result output of a previous CRC circuit connected to the seed input of an immediately subsequent CRC circuit. Each result output of each CRC circuit 130 is also connected to a different input of result multiplexer 140. Multiplexer 140 is responsive to a SEL signal generated by control logic 135. The output of result multiplexer 140 is connected to the seed input of the first CRC circuit 130 (the one receiving bits 1 to M). The SEL signal chooses the result of the CRC circuit processing the last bits of the current data. The result outputs of each CRC circuit 130 form the CRC RESULT of CRC generator/checker 125. CRC generator/checker 125 processes data units in C by M-bit groups. Control logic 135 generates one bit control signals CNTRL1 through CNTRLC based on the number of bits (up to a maximum of C×M) of the current data unit on data bus 145. Each control signal CNTRL1 through CNTRLC, which are dependent on the delimiters of current data units in the data stream on data bus 145, is connected to a corresponding control input of CRC circuits 130.

In one example, a logical 1 control signal on a particular CRC circuit 130 will disconnect the seed input from of the particular CRC circuit from the result output of a previous CRC circuit 130 and cause the particular CRC to generate a reset K-bit seed. In one example, the seed is all logical 0s. In one example, N is 32 and C is 4 and K is CRC parameter dependent. Thus, in this example, CRC circuits 130 are 4-byte CRC circuits, that is, capable of processing 4-bytes of data at a time. The operation of CRC generator/checker 125 is similar to that of CRC generator/checker 100 of FIG. 1 and described supra.

A limitation of CRC generator/checker circuit 100 of FIG. 1 is the number of 1-byte concatenations that can be done in one clock cycle may be limited by the circuit design, wiring delays and technology of the integrated circuit incorporating the CRC generator/checker. The third and fourth embodiments of the present invention overcome this limitation. The third embodiment of the present invention uses a limitation of the number L of 1-byte CRC concatenations that can be done in one clock cycle. L is a function of the speed limitation of a given integrated circuit technology. In one example L=10. The fourth embodiment of the present invention uses the general limitation of L.

Figure 4:
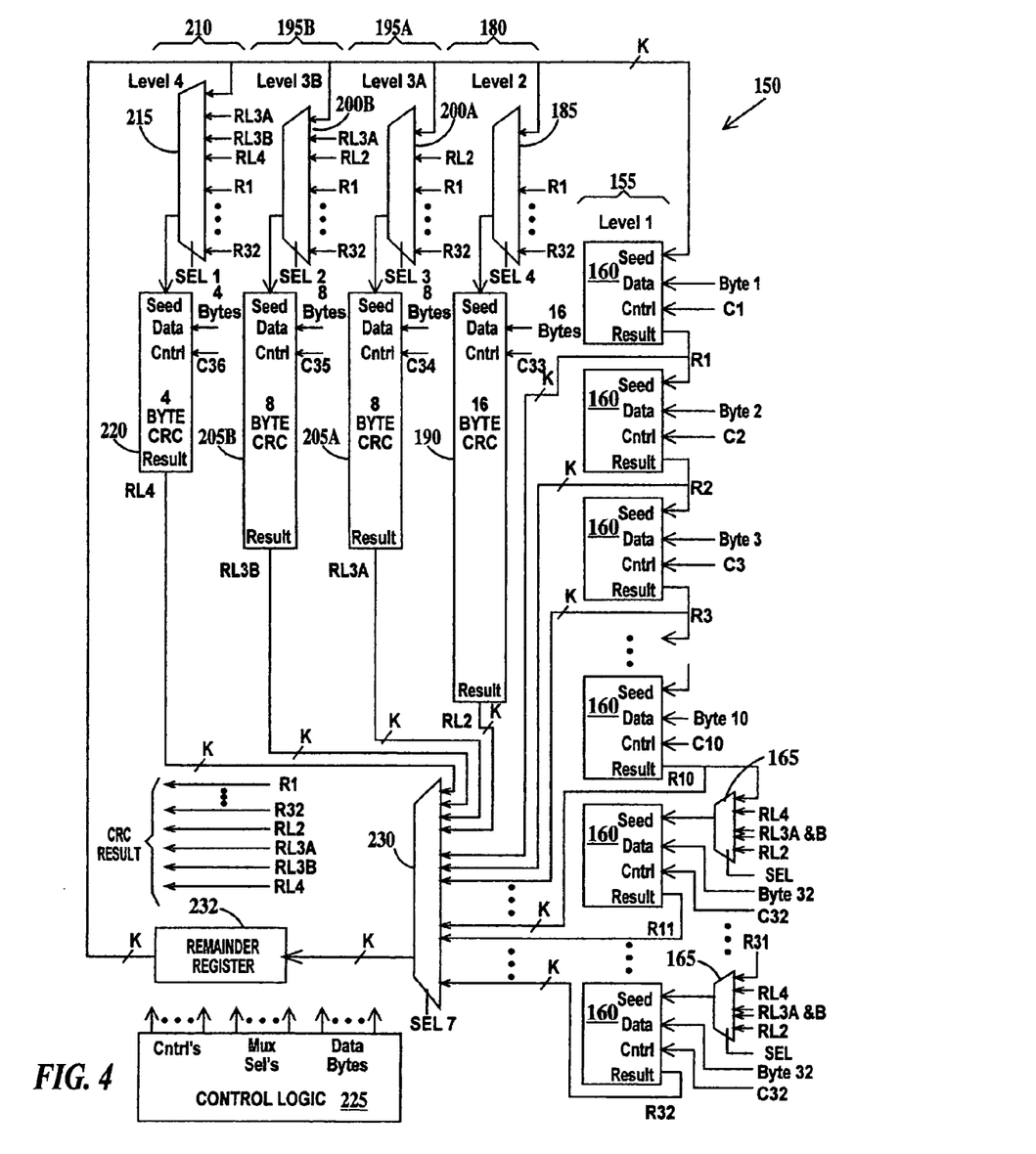
FIG. 4 is a schematic diagram of a specific CRC generator/checker circuit according to a third embodiment of the present invention.

FIG. 4 is a schematic diagram of a specific CRC generator/checker circuit 150 according to a third embodiment of the present invention. In FIG. 4, a 32-byte data bus is assumed. CRC generator/checker circuit 150, includes a first level result generator 155 which includes 32, 1-byte (8-bit) CRC circuits 160, and a set of multiplexers 165 connected to corresponding byte 11 through byte 32 CRC circuits 160. CRC generator/checker circuit 150 further includes a second level result generator 180 including a multiplexer 185 and a 16-byte CRC circuit 190, two third level result generators 195A and 195B including respective multiplexers 200A and 200B and corresponding 8-byte CRC circuits 205A and 205B, a fourth level result generator 210, including a multiplexer 215 and a 4-byte CRC generator 220, a control logic 225, a result multiplexer 230 and a CRC remainder register 232. There are two third level result generators 195A and 195B in order to handle the case where two data units greater than 10 bytes but less than 16 bytes occur in succession. The number of 8-byte, CRC generators (Q) is determined by the equation (1).

$$Q = \lfloor |W/(L+1)| \rfloor \quad (1)$$

where:
Q=the largest integer not exceeding $|W/(L+1)|$;
W=the number of 1-byte CRC circuits in the first level result generator and the width of the data bus; and
L=the number of 1-byte CRC concatenations that can be done by 1-byte CRC circuits in one clock cycle.

Substituting W=32 and L=10 gives Q=2.

Each CRC circuit 160, 190, 205A, 225B and 220 has a seed input, a data input, a control input and a K-bit result output. Control logic 225 is adapted to receive data from a 32-byte wide data bus (not shown). Control logic 225 generates control signals for each CRC circuit 160, 190, 205A, 205B, and 220 select signals for each multiplexer 165, 185, 200A, 200B, 215 and 230 and directs specific data bytes of a current data unit to the appropriate data input of each CRC circuit 160, 190, 205A, 205B and 220 based on the number of bytes of data in the current data unit.

It should be understood, due to the cyclic nature of CRC generator/checker 150 that references in the description of the structure of the CRC generator/checker to a CRC circuit connected to a designated byte (byte 1, byte 2, etc.) means that a wiring path to control logic 225 from the data input bearing that designation of the CRC circuit exists, but the actual presence of data on that wire and the specific data byte of a specific data unit on that wire is conditional on the number of data bytes in the current data unit and previous data units and is controlled by control logic 225. The direction of particular data bytes of a data unit to particular CRC circuits is described infra.

CRC circuits 160 are connected in series, the result output of a previous CRC circuit 160 connected to the seed input of an immediately subsequent CRC circuit 160 though for the 10 byte through 31 byte CRC circuits 160 the input is through a multiplexer 165. Each data input of each CRC circuit 160 is adapted to receive a single data byte as directed by control logic 225. The data input of the first CRC circuit 160 in the series is connected to byte 1, the data input of the second CRC circuit 160 is connected to byte 2 so on until the data input of the 32nd CRC circuit 160 is connected to byte 32. The result of the first CRC circuit 160 in the series is R1, the result of the second CRC circuit 160 is R2 so on until the result of the 32nd CRC circuit 160 is R32. The seed inputs of 10 byte through 31 byte CRC circuits 160 are connected to the output of corresponding multiplexer 165. The inputs of multiplexers 165 are connected to the result outputs of corresponding immediately previous CRC circuits 160 and to the outputs CRC circuits 190, 205A, 205B and 220, which are results RL2, RL3A, RL3B, RL4 respectively. Each result output of each CRC circuit 160 (R1 through R32) with RL2, RL3A, RL3B and RL4 are connected to a different input of result multiplexer 230. The output of result multiplexer 230 is connected to the input of remainder register 232. The output of remainder register 232 is connected to inputs of multiplexers 185, 200A, 200B and 215, and the seed input of byte 1 CRC 160. Results R1 through R32, RL2, RL3A, RL3B and RL4 are the CRC RESULT of CRC generator/checker 150.

First level result generator 155 functions similarly as CRC generator/checker 100 of FIG. 1 except for the addition of multiplexers 165, which account for cycles through CRC circuits 190, 205A, 205B and 220.

The data input of CRC circuit 190 is adapted to receive 16 bytes of data as directed by control logic 225. The seed input of CRC circuit 190 is the output of multiplexer 185. The inputs of multiplexer 185 are the output of remainder register 232 and R1 to R32.

The data input of CRC circuit 205A is adapted to receive 8 bytes of data as directed by control logic 225. The seed input of CRC circuit 205A is the output of multiplexer 200A. The inputs of multiplexer 200A are the output of remainder register 232, RL2 and R1 to R32.

The data input of CRC circuit 205B is adapted to receive 8 bytes of data as directed by control logic 225. The seed input of CRC circuit 205B is the output of multiplexer 200B. The inputs of multiplexer 200B are CRC the output of remainder register 232, RL2, RL3A and R1 to R32.

The data input of CRC circuit 220 is adapted to receive 4 bytes of data as directed by control logic 225. The seed input of CRC circuit 220 is the output of multiplexer 215. The inputs of multiplexer 215 are CRC RESULT, RL4, RL3A, RL3B and R1 to R32.

While multiplexers 185, 200A, 200B and 215 are illustrated and described as separate from corresponding CRC circuits 190, 205A, 205B and 220, the multiplexers may be incorporated into the corresponding CRC circuits. Similarly, multiplexers 165 may be incorporated into the 11th byte and 32nd byte CRC circuits 160.

When CRC generator/checker 150 receives data units, control logic 220 determines the data unit sizes and data unit boundaries (the separation between adjacent data units). For CRC circuits 160, the byte location of unit boundaries determines whether the seed input of a particular CRC circuit 160 remains connected to the output result of the previous CRC circuit 160 or an all 0 seed is generated within the CRC circuit 160. For CRC circuits 190, 205A, 205B and 220, the data unit boundary determines whether the seed is a result from multiplexer 185, 200A, 200B or 210 respectively or all zeros. Note, the seed need not be all zeros, but may be any combination of ones and zeros depending upon the design of the CRC circuits. Control logic 225 then directs the various bytes of the data unit to specific CRC circuits according to the rules in TABLE 1. It should be remembered that Table 1 is for L=10 and if a data unit is more than 32 bytes, it is processed as groups of 32 bytes plus one group of MOD(number of bytes in the data unit). Also, the specific 1-byte CRC circuits 160 (if any) used, depends upon the previous byte loading of the 1-byte data CRC circuits 160.

TABLE 1

| Bytes In Data Unit | CRC Circuits |
|---|---|
| 1 to 10 Bytes | Use 1 to 10 1-byte CRC circuits |
| 11 Bytes | Use 1 8-byte and 3 1-byte CRC circuits |
| 12 Bytes | Use 1 8-byte and 4 1-byte CRC circuits |
| 13 Bytes | Use 1 8-byte, 1 4-byte and 1 1-byte CRC circuits |
| 14 Bytes | Use 1 8-byte, 1 4-byte and 2 1-byte CRC circuits |

TABLE 1-continued

| Bytes In Data Unit | CRC Circuits |
| --- | --- |
| 15 Bytes | Use 1 8-byte, 1 4-byte and 3 1-byte CRC circuits |
| 16 Bytes | Use 1 8-byte, 1 4-byte and 4 1-byte CRC circuits |
| 17 Bytes | Use 1 16-byte and 1 1-byte CRC circuits |
| 18 Bytes | Use 1 16-byte and 2 1-byte CRC circuits |
| 19 Bytes | Use 1 16-byte and 3 1-byte CRC circuits |
| 20 Bytes | Use 1 16-byte and 4 1-byte CRC circuits |
| 21 Bytes | Use 1 16-byte, 1 4-byte and 1 1-byte CRC circuits |
| 22 Bytes | Use 1 16-byte, 1 4-byte and 2 1-byte CRC circuits |
| 23 Bytes | Use 1 16-byte, 1 4-byte and 3 1-byte CRC circuits |
| 24 Bytes | Use 1 16-byte, 1 4-byte and 4 1-byte CRC circuits |
| 25 Bytes | Use 1 16-byte, 1 8-byte and 1 1-byte CRC circuits |
| 26 Bytes | Use 1 16-byte, 1 8-byte and 2 1-byte CRC circuits |
| 27 Bytes | Use 1 16-byte, 1 8-byte and 3 1-byte CRC circuits |
| 28 Bytes | Use 1 16-byte, 1 8-byte and 4 1-byte CRC circuits |
| 29 bytes | Use 1 16-byte, 1 8-byte, 1 4-byte and 1 1-byte CRC circuits |
| 30 bytes | Use 1 16-byte, 1 8-byte, 1 4-byte and 2 1-byte CRC circuits |
| 31 bytes | Use 1 16-byte, 1 8-byte, 1 4-byte and 3 1-byte CRC circuits |
| 32 bytes | Use 1 16-byte, 1 8-byte, 1 4-byte and 4 1-byte CRC circuits or use 1 16-byte and 2 8-byte CRC circuits |

Taking the example of an initial loading of successive data units of sizes 11-bytes, 11 bytes and 10 bytes, control logic 225 would allocate CRC circuits as follows:

(1) the first 11-byte data unit uses three 1-byte CRC circuits 160 with the byte 1 CRC circuit 160 seed all zeros, the byte 2 CRC circuit 160 seed R1 and the byte 3 CRC circuit 160 seed R2 and the first 8-byte CRC circuit 205A with seed R3 and the result of the CRC calculation is RL3A; and (2) the second 11-byte data unit uses three 1-byte CRC circuits 160 with the byte 4 CRC circuit 160 seed all zeros, the byte 5 CRC 160 seed R4, the byte 6 CRC circuit 160 seed R5 and the second 8-byte CRC circuit 205B with seed R6 and the result of the CRC calculation is RL3B; and (3) the 10-byte data units uses ten 1-byte CRC circuits byte 7 CRC circuit 160 through byte 16 CRC circuit 160, the seed of byte 7 CRC circuit 160 is all zeros. Others are seeded with the immediately previous 1-byte CRC circuit 160 result.

Logic circuit 225 is designed such that it allocates data units such that a worst-case CRC calculation requiring all four levels of processing (32 bytes data using one 16-byte CRC plus one 8-byte CRC plus one 4-byte CRC plus 4 1-byte CRC, can be completed in one clock cycle.

Figure 5:
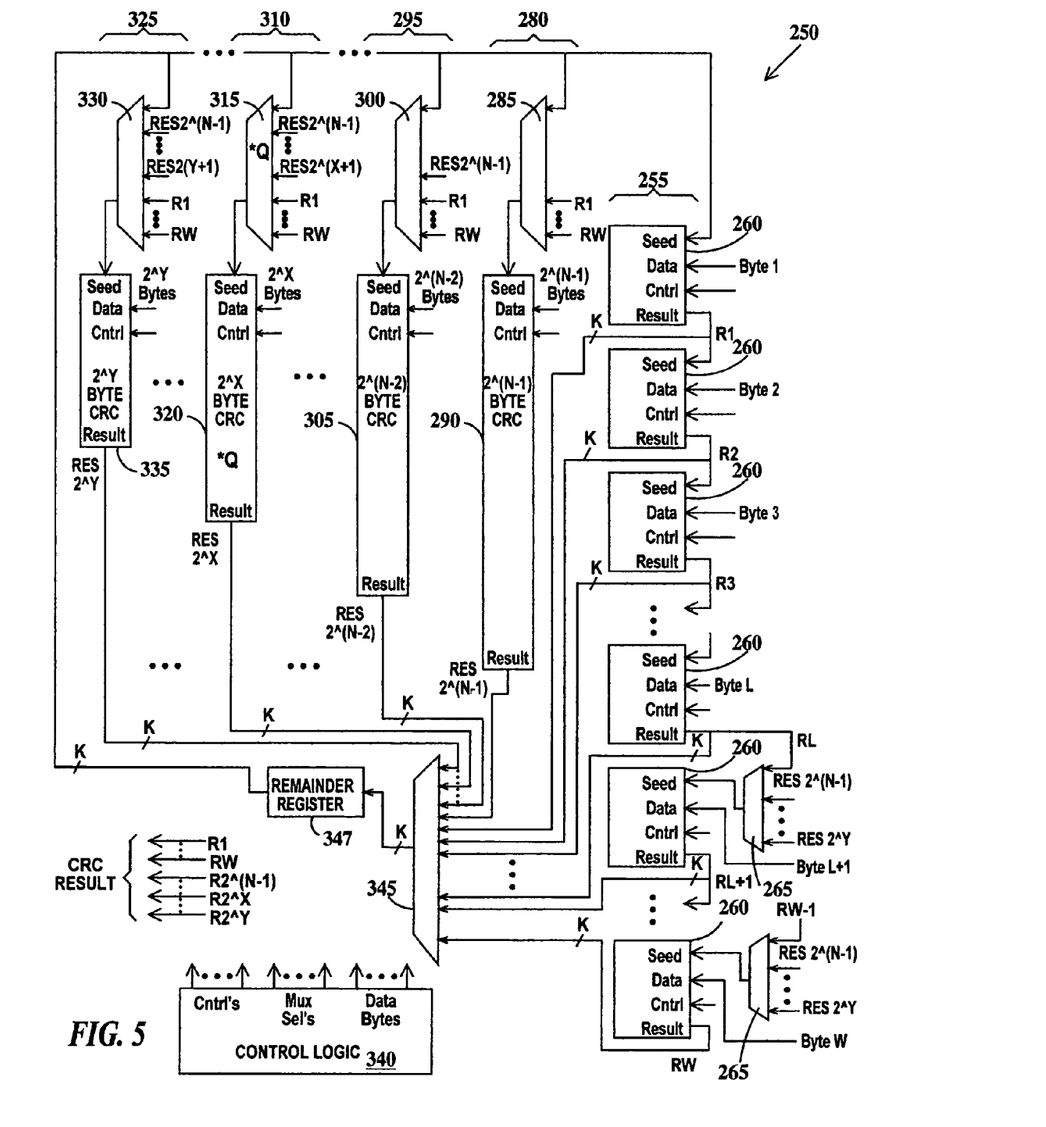
FIG. 5 is a schematic diagram of a general CRC generator/checker circuit according to a fourth embodiment of the present invention.

FIG. 5 is a schematic diagram of a general CRC generator/checker circuit 250 according to a fourth embodiment of the present invention. In FIG. 5, a W-byte data bus is assumed. CRC generator/checker circuit 250 includes a first level result generator 255 which includes W of 1-byte (8-bit) CRC circuits 260, (W-L) multiplexers 265 connected to corresponding byte L+1 through byte W CRC circuits 260. L is the number of 1-byte CRC concatenations that can be done in one clock cycle as described supra. With this method, high resolution, CRC calculation on any size data unit can be accomplished while avoiding customer design for each very high speed network requiring cyclic redundancy checking.

CRC generator/checker circuit 250 further includes a $2^{(N-1)}$ (second level) result generator 280 including a multiplexer 285 and a $2^{(N-1)}$-byte CRC circuit 290, a $2^{(N-2)}$ (third level) result generator 295 including, a multiplexer 300 and a $2^{(N-2)}$-byte CRC circuit 305, and additional $2^Z$ result generators, in the series with Z is integer from (N−3) to X+1 if (N−3)>=X+1. If (N−3)<X+1, then there's no $2^Z$ result generator in between N is defined by $2^N>W>=2^{(N-1)}$, X is defined by $(2^X) \leq L$ and $(2^{(X+1)})>L$.

CRC generator/checker 250 further includes Q sets of $(2^X)$ result generators 310, each including a multiplexer 315 and $(2^X)$-byte CRC generator 320. Q=[|W/(L+1)|] as defined supra in equation (1). There are Q multiplexers 315 and $(2^X)$ result generators 310.

CRC generator/checker 250 further includes a last level $2^Y$ result generator 325 including a multiplexer 330 and a $(2^Y)$-byte CRC circuit 335. There are also additional $2^P$ result generators in the series with P is integer from Y−1, to X−1 if X>Y. If X<=Y, there is no $2^P$ result generator in between.

Each CRC circuit 260, 290, 305, 320 and 335 has a seed input, a data input, a control input and a K-bit result output where K is CRC parameter dependent. The output of result multiplexer 345 is connected to the input of a remainder register 347. The output of remainder register 347 is connected to one input of each multiplexer 280, 295, 310 and 325 and the seed input of byte-1 CRC circuit 260. Control logic 340 generates control signals for each CRC circuit 260, 290, 305, 320 and 335 select signals for each multiplexer 265, 285, 300, 315, 330 and 345 and directs specific data bytes of a current data units to the appropriate data input of each CRC circuit 260, 290, 305, 320 and 335 based on the number of bytes of data in the current data unit.

CRC circuits 260 are connected in series, the result output of a previous CRC circuit 260 connected to the seed input of an immediately subsequent CRC circuit 260 from byte 1 to byte L CRC circuits 260 though for byte (L+1) to byte W CRC circuits 260 the input is through a multiplexer. Each data input of each CRC circuit 260 is adapted to receive a single data byte as directed by control logic 340. The data input of the first CRC circuit 260 in the series is connected to byte 1, the data input of the second CRC circuit 260 is connected to byte 2 so on until the data input of the Wth CRC circuit 260 is connected to byte W. The result of the first CRC circuit 260 in the series is R1, the result of the second CRC circuit 260 is R2 so on until the result of the Wth CRC circuit 260 is RW. The seed input of the byte L through byte W CRC circuits 260 are connected to the output of respective multiplexer 265. One input of each multiplexer 265 is connected to the result output of the immediately previous CRC circuit 260 and to the outputs of $(2^{(N-1)})$ CRC circuit 290, $(2^{(N-2)})$ CRC circuit 305, . . . , $(2^X)$ CRC circuit 320, . . . , $(2^Y)$ CRC circuit 335 and all intervening CRC circuits between CRC circuit 305 and 320 and between CRC circuit 320 and 335 which are respectively, results RES $2^{(N-1)}$, RES2$^{(N-2)}$ through Q of RES $2^X$ and through RES2$^Y$.

Each result output of each CRC circuit 260 (R1 through RW) is connected to a different input of result multiplexer 345. First level result generator functions similarly as CRC generator/checker 100 of FIG. 1 except for the addition of multiplexers 265, which allows the results of CRC circuits 290, 305, 320 and 335 to be used as seeds.

The data input of CRC circuit 290 is adapted to receive $2^{(N-1)}$ bytes of data as directed by control logic 340. The seed input of CRC circuit 290 is the output of multiplexer 285. The inputs of multiplexer 285 are the output of remainder register 347 and R1 to RW.

The data input of CRC circuit 305 is adapted to receive $2^{(N-2)}$ bytes of data as directed by control logic 340. The seed input of CRC circuit 305 is the output of multiplexer 300. The inputs of multiplexer 300 are the output of remainder register 347, RES2^(N−1) and R1 to RW.

The data input of CRC circuits 320 are adapted to receive 2^X bytes of data as directed by control logic 340. The inputs of multiplexers 315 are the output of remainder register 347, RES2^(N−1) through RES2^(X+1), any RES2^X in lower level (not shown in FIG. 5) and R1 to RW.

The data input of CRC circuit 335 is adapted to receive 2^Y bytes of data as directed by control logic 340. The seed inputs of CRC circuit 335 are the output of multiplexer 330. The inputs of multiplexer 330 are the output of remainder register 347, RES2^(N−1) through RES2(Y+1) and R1 to RW.

The output of CRC generator/checker 250 are R1 though R32, RES2^(N−1), 2^(N−2), . . . , Q modules of 2^X, . . . , 2^Y.

While multiplexers 285, 300, 315 and 330 are illustrated and described as separate from corresponding CRC circuits 290, 305, 320 and 335, the multiplexers may be incorporated into the corresponding CRC circuits. Similarly, multiplexers 265 may be incorporated into the (L+1) byte through W byte CRC circuits 260.

When CRC generator/checker 250 receives a data unit, control logic 340 determines the data unit size and data unit boundary (the separation between adjacent data units). For CRC circuits 260, the data unit boundary determines whether seed inputs of a particular CRC circuit 260 remains connected to the output result of the previous CRC circuit 260 or an all 0 seed is generated within the CRC circuit 260. For CRC circuits 290, 305, 320 and 335, the data unit boundary determines the seed is a result from multiplexer 285, 300, 315 or 330 respectively or all zeros. Note, the seed need not be all zeros, but all ones or any combination of ones and zeros depending upon the design of the CRC circuits. Control logic 340 then directs the various bytes of the data unit to specific CRC circuits according to the rules in a manner similar to that described for CRC generator/checker 150 (see FIG. 3) in TABLE 1 supra. If a data unit is more than W-bytes, it is processed as groups of W bytes plus one group of as many bytes that remain after processing groups of W bytes.

The timing criteria for CRC generator 250 is defined by (1) each multi-byte CRC circuit 280, 295, only one multi-byte CRC circuit 310 (though there are Q modules) and multi-byte CRC circuit 335 and all intervening multi-byte CRC circuits processing different numbers of bytes of data selected from the series of powers of two bytes in the range 2^(N−1) to 2^Y where 2^(N−1) is equal to the number of CRC circuits 260 and Y is less than (N−1) and where Y is chosen such the number of concatenated multi-byte CRC calculations performed plus (W−[2^(N−1)+2^(N−2)+ . . . +2^X+ . . . +2^Y]) concatenated 1-byte CRC circuit 260 calculations can be performed in a single clock cycle and (2) the number Q of identical multi-byte CRC circuits able to process (2^X)-bytes of data is defined by the largest integer not exceeding |W/(L+1)| where W, the data bus width, is also the number of CRC circuits 260 and where X is defined by (2^X)≦L and 2^(X+1)>L where L is a maximum number of 1-byte concatenated CRC calculations that can be done by CRC circuits 160 in a single clock cycle. Further, logic circuit 340 is designed such that it allocates data units such that a worst-case CRC calculation requiring all levels of processing can be completed in one clock cycle.

Returning to FIG. 4, the timing criteria described supra when applied to CRC generator/checker 150 is met with W=32, L=10, N=5, X=3, Y=2 and Q=2.

Thus, the present invention provides an improved CRC generation/checking methodology and circuit design is required for high speed, high resolution and high bandwidth digital communication applications.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A CRC generator/checker for generating CRC results, comprising:
  a set of CRC circuits connected in series, each CRC circuit responsive to a different control signal generated by a control logic, each CRC circuit having a seed input adapted to receive a seed;
  a data input adapted to receive and process a different set of M-bits of a data unit and a result output adapted to generate a result, the result output of a previous CRC circuit connected to the seed input of an immediately subsequent CRC circuit, the seed input of a first CRC circuit connected to an output of a remainder register; and
  an input of said remainder register connected to an output of a multiplexer, the result outputs of said set of CRC circuits connected to different inputs of said multiplexer, said multiplexer responsive to a select signal generated by said control logic.

2. The CRC generator/checker of claim 1, wherein said control logic is adapted to generate said select signal based on the bit width of said data unit, said control signals causing a particular CRC circuit to generate a result based on a particular set of M-bits and the result of a previous CRC circuit or the contents of said remainder register if the particular CRC circuit is said first CRC circuit, or based on the particular set of M-bits or the contents of said remainder register if the particular CRC circuit is said first CRC circuit and an internally generated seed.

3. The CRC generator/checker of claim 1, wherein a number of said CRC circuits is equal to the highest integer not exceeding the width in bits of a data bus supplying said data unit divided by M.

4. The CRC generator/checker of claim 1, wherein M is 8.

5. The CRC generator/checker of claim 1, wherein M=8 and further including:
  a set of multi-byte CRC circuits, each multi-byte CRC circuit adapted to simultaneously process a multiple number of bytes of said data unit;
  each multi-byte CRC circuit responsive to a different additional control signal generated by said control logic, each multi-byte CRC circuit having a seed input adapted to receive a seed selectable from said remainder register, all result outputs of said CRC circuits and the result outputs from all higher byte number multi-byte CRC circuits, a data input adapted to receive said multiple number bytes of data and a result output adapted to generate a result, the result output of each multi-byte CRC circuit connected to different additional inputs of said multiplexer; and
  said additional control signals causing a particular multi-byte CRC circuit to generate a result based on multiple byte data and said selectable seed or based on said multiple-byte data and an internally generated seed.

6. The CRC generator/checker of claim 5, wherein:
each multi-byte CRC is adapted to process a different number of bytes of data selected from the series of powers of two bytes in the range $2^{(N-1)}$ to $2^Y$ where $2^{(N-1)}$ is equal to a number of said CRC circuits in said set of CRC circuits and Y is less than (N−1); and
wherein Y is chosen such the number of concatenated multi-byte CRC calculations performed plus $\{W-[2^{(N-1)}+2^{(N-2)}+\ldots+2^Y]\}$ concatenated 1-byte CRC calculations can be performed in a single clock cycle and where W is the width in bytes of a data bus supplying said data unit and the number of CRC circuits.

7. The CRC generator/checker of claim 6, further including a total of Q identical multi-byte CRC circuits selected from said set of multi-byte circuits wherein the Q identical multi-byte CRC circuits are adapted to process $(2^X)$-bytes of data where X is defined by $(2^X) \leq L$ and $2^{(X+1)} > L$ where L is a maximum number of 1-byte concatenated CRC calculations that can be done by said CRC circuits in a single clock cycle, and Q is defined by the largest integer not exceeding $|W/(L+1)|$ where and where W is the width in bytes of a data bus supplying said data unit and the number of CRC circuits.

8. The CRC generator/checker of claim 7, wherein:
a subset of CRC circuits comprising the last (W-L) CRC circuits of said multiplicity of CRC circuits have seed inputs adapted to receive a seed selectable from an immediately previous CRC circuit and the result outputs of all of said multi-byte CRC circuits, the output result of each CRC circuit of said subset of CRC circuits based on said selectable seed and a corresponding byte of data or based on an internally generated seed and said corresponding byte of data.

9. The CRC generator/checker of claim 8, wherein W=32, L=10, N=5, X=3, Y=2 and Q=2.

10. The CRC generator/checker of claim 8, wherein said CRC result is generated in one clock cycle.

11. The CRC generator/checker of claim 1, wherein the number of CRC circuits is scalable to a width of said data bus.

12. A CRC generator/checker, comprising:
a multiplicity of CRC circuits adapted to process a single-byte of data from a data bus, each CRC circuit having a seed input, a data input adapted to receive a different byte of data from said bus, a control input and a result output;
an multiplexer having an output connected to an input of a remainder register, a select input and a multiplicity of inputs, each result output of each said CRC circuit connected to a different input of said multiplexer;
each CRC circuit connected in series, the result output of a previous CRC circuit connected to the seed input of an immediately subsequent CRC circuit, the seed input of a first CRC circuit connected to an output of said remainder register; and
a control logic having a select output and a multiplicity of control outputs, said select output connected to said select input of said multiplexer and said control outputs connected to corresponding control inputs of said CRC circuits.

13. The CRC generator/checker of claim 12, further including:
a set of multi-byte CRC circuits, each having a seed input, a control input and a result output connected to different additional inputs of said multiplexer and each multi-byte circuit adapted to simultaneously process a multiple number of bytes of data;
each multi-byte CRC circuit responsive to a different additional control signal generated by said control logic, the seed input of each multi-byte CRC circuit adapted to receive a selectable seed selectable from all result outputs of said CRC circuits and the result outputs from any higher-byte number multi-byte CRC circuit, the data input of each multi-byte CRC circuit adapted to receive a different set of multi-bytes of said, the result output of each multi-byte CRC circuit; and
said additional control signals causing a particular multi-byte CRC circuit to generate a result based on a corresponding multiple bytes of said data and said selectable seed or based on said corresponding multi-bytes of said data and an internally generated seed.

14. CRC generator/checker of claim 13, wherein:
each multi-byte CRC is adapted to process a different number of bytes of data selected from the series of powers of two bytes in the range $2^{(N-1)}$ to $2^Y$ where $2^{(N-1)}$ is equal to a number of said CRC circuits in said set of CRC circuits and Y is less than (N−1); and
wherein Y is chosen such the number of concatenated multi-byte CRC calculations performed plus $\{W-\{2^{(N-1)}+2(N-2)+\ldots+2^Y]\}$ concatenated 1-byte CRC calculations can be performed in a single clock cycle and where W is the width in bytes of said data bus and the number of CRC circuits.

15. The CRC generator/checker of claim 14, further including a total of Q identical multi-byte CRC circuits selected from said set of multi-byte circuits wherein the Q identical multi-byte CRC circuits are adapted to process $(2^X)$-bytes of data where X is defined by $(2^X) \leq L$ and $2^{(X+1)} > L$ where L is a maximum number of 1-byte concatenated CRC calculations that can be done by said CRC circuits in a single clock cycle, and Q is defined by the largest integer not exceeding $|W/(L+1)|$ and where W is the width in bytes of said data bus and the number of CRC circuits.

16. The CRC generator/checker of claim 15, wherein:
a subset of CRC circuits comprising the last (W-L) CRC circuits of said multiplicity of CRC circuits have seed inputs adapted to receive a seed selectable from an immediately previous CRC circuit and the result outputs of all of said multi-byte CRC circuits, the output result of each CRC circuit of said subset of CRC circuits based on said selectable seed and a corresponding byte of data or based on an internally generated seed and said corresponding byte of data.

17. The CRC generator/checker of claim 16, wherein W=32, L=10, N=5, X=3, Y=2 and Q=2.

18. The CRC generator/checker of claim 16, wherein said CRC result is generated in one clock cycle.

19. The CRC generator/checker of claim 12, wherein the number of CRC circuits is scalable to a byte width of said data bus.

20. A method of generating and checking a CRC result, comprising:
providing a control circuit for generating control signals and a select signal;
providing a multiplexer; and
providing a set of CRC circuits connected in series, each CRC circuit responsive to a different control signal generated by a control logic, each CRC circuit having a seed input adapted to receive a seed;

providing a data input adapted to receive and process a different set of M-bits of a data unit and a result output adapted to generate a result, the result output of a previous CRC circuit connected to the seed input of an immediately subsequent CRC circuit, the seed input of a first CRC circuit connected to an output of a remainder register; and providing an input of said remainder register connected to an output of said multiplexer, the result outputs of said multiplicity of CRC circuits connected to different inputs of said multiplexer, said multiplexer responsive to a select signal generated by said control logic.

21. The method of claim 20, further including:

generating said select signal based on the bit width of said data;

said control signals causing a particular CRC circuit to generate a result based on a particular set of M-bits and the result of a previous CRC circuit or the contents of said remainder register if the particular CRC circuit is said first CRC circuit, or based on the particular set of M-bits or the contents of said remainder register if the particular CRC circuit is said first CRC circuit and an internally generated seed.

22. The method of claim 20, wherein a number of said CRC circuits is equal to the highest integer not exceeding the width in bits of a data bus supplying said data unit divided by M.

23. The method of claim 20, wherein M is 8.

24. The method of claim 20, wherein M=8 and further including:

providing a set of multi-byte CRC circuits, each multi-byte CRC circuit adapted to simultaneously process a multiple number of bytes of said data unit;

each multi-byte CRC circuit responsive to a different additional control signal generated by said control logic, each multi-byte CRC circuit having a seed input adapted to receive a seed selectable from said remainder register, all result outputs of said CRC circuits and the result outputs from all higher byte number multi-byte CRC circuits, a data input adapted to receive said multiple number bytes of data and a result output adapted to generate a result, the result output of each multi-byte CRC circuit connected to different additional inputs of said multiplexer; and said additional control signals causing a particular multi-byte CRC circuit to generate a result based on multiple byte and said selectable seed or based on said multiple-byte data and an internally generated seed.

25. The method of claim 24, wherein:

each multi-byte CRC is adapted to process a different number of bytes of data selected from the series of powers of two bytes in the range $2^{(N-1)}$ to $2^Y$ where $2^{(N-1)}$ is equal to a number of said CRC circuits in said set of CRC circuits and Y is less than (N−1); and further including choosing Y such the number of concatenated multi-byte CRC calculations performed plus $\{W-[2^{(N-1)}+2^{(N-2)}+ \ldots +2^Y]\}$ concatenated 1-byte CRC calculations can be performed in a single clock cycle and where W is the width in bytes of a data bus supplying said data unit and the number of CRC circuits.

26. The method of claim 25, further including providing a total of Q identical multi-byte CRC circuits selected from said set of multi-byte circuits wherein the Q identical multi-byte CRC circuits are adapted to process $(2^X)$-bytes of data where X is defined by $(2^X) \leqq L$ and $2^{(X+1)} > L$ where L is a maximum number of 1-byte concatenated CRC calculations that can be done by said CRC circuits in a single clock cycle, and Q is defined by the largest integer not exceeding $|W/(L+1)|$ and where W is the width in bytes of a data bus supplying said data unit and the number of CRC circuits.

27. The method of claim 26, wherein:

providing a subset of CRC circuits, said subset of CRC circuits comprising the last (W-L) CRC circuits of said multiplicity of CRC circuits and having seed inputs adapted to receive a seed selectable from an immediately previous CRC circuit and the result outputs of all of said multi-byte CRC circuits, the output result of each CRC circuit of said subset of CRC circuits based on said selectable seed and a corresponding byte of data of said data or based on an internally generated seed and said corresponding byte of data of said data.

28. The CRC generator/checker of claim 26, wherein W=32, L=10, N=5, X=3, Y=2 and Q=2.

29. The method of claim 26, wherein said CRC result is generated in one clock cycle.

30. The method of claim 20, wherein the number of CRC circuits is scalable to a width of said data bus.

* * * * *